United States Patent
Lebby et al.

[11] Patent Number: 5,838,703
[45] Date of Patent: Nov. 17, 1998

[54] SEMICONDUCTOR LASER PACKAGE WITH POWER MONITORING SYSTEM AND OPTICAL ELEMENT

[75] Inventors: Michael S. Lebby, Apache Junction; John W. Stafford; Wenbin Jiang, both of Phoenix, all of Ariz.

[73] Assignee: Motorola, Inc., Schaumburg, Ill.

[21] Appl. No.: 719,829

[22] Filed: Sep. 30, 1996

[51] Int. Cl.⁶ .............................. H01S 3/18; H01S 3/13; H01S 3/04; H01S 3/08
[52] U.S. Cl. ................... 372/43; 372/29; 372/31; 372/36; 372/101; 372/50
[58] Field of Search ................ 372/29, 30, 31, 372/36, 43, 50, 101, 109; 257/81, 98, 99, 432–434, 680, 731–2; 369/112, 44.24; 359/15, 19

[56] References Cited

U.S. PATENT DOCUMENTS

| | | | |
|---|---|---|---|
| 4,458,980 | 7/1984 | Ohki et al. | 259/19 |
| 5,136,603 | 8/1992 | Hasnain et al. | 372/50 |
| 5,291,316 | 3/1994 | Haberman et al. | 359/15 |
| 5,377,177 | 12/1994 | Horinouchi et al. | 369/44.24 |
| 5,485,479 | 1/1996 | Kitamura et al. | 372/43 |
| 5,500,768 | 3/1996 | Doggett et al. | 359/652 |

FOREIGN PATENT DOCUMENTS

| | | | |
|---|---|---|---|
| 62-105486 | 5/1987 | Japan | 257/98 |
| 62-252154 | 11/1987 | Japan | 257/434 |
| 2-125688 | 5/1990 | Japan | 372/43 |
| 4-48673 | 2/1992 | Japan | 372/43 |
| 5-299779 | 11/1993 | Japan . | |

*Primary Examiner*—John D. Lee
*Assistant Examiner*—Quyen Phan Leung
*Attorney, Agent, or Firm*—Eugene A. Parsons

[57] ABSTRACT

A semiconductor laser package including a mounting structure at least partially encapsulating a vertical cavity surface emitting laser and a photodetector. The vertical cavity surface emitting laser generating an emission along a path. The photodetector optically positioned and/or integrally formed with the vertical cavity surface emitting laser to receive a portion of the emission. An optical element is optionally positioned in the path, mounted on the mounting structure utilizing a snap-fit connection, a threaded or adhesive mounting. The mounting structure and optical element are fabricated to allow for proper z-axis alignment of the optical element relative to the laser emission aperture.

23 Claims, 3 Drawing Sheets

SEMICONDUCTOR LASER PACKAGE WITH POWER MONITORING SYSTEM AND OPTICAL ELEMENT

FIELD OF THE INVENTION

The present invention pertains to semiconductor lasers and more specifically to the packaging of semiconductor lasers.

BACKGROUND OF THE INVENTION

Since the development of laser diodes, many applications for their use have been developed. Increasingly, laser diodes are employed for communications, bar code scanning, laser printing, and are integral to optical disc recording and storage systems. Typically, edge emitting diode lasers are used. Edge emitting diode lasers, however, have a high cost in parallel and serial data links due to reliability requirement, and have a high current drain due to a high threshold current when used in compact disc pickups.

New systems are being developed to employ vertical cavity surface emitting lasers (VCSELs) in place of edge emitting lasers. The VCSELs provide a much lower cost, use surface emissions which simplify optical device packaging and are capable of being fabricated in larger volumes on semiconductor wafers. However, a problem exist in the packaging of such VCSELs, namely the cost of materials employed in the typical "can" type packages which have been the de-facto standard :for edge emitting laser diodes. The conventional semiconductor laser apparatus utilizes a metal TO-can for packaging, and includes the formation of a "window" within a cap portion of the can through which the laser emission passes. In that metal is utilized in which a "window" must be formed, the cost of materials impacts the yield. In addition, an external lens has to be employed for laser beam focusing or collimating. The alignment of a TO-can type laser package to the lens also increases the system assembling cost. Therefore, there exist a need for packaging of vertical cavity surface emitting lasers that would reduce the cost of manufacture.

In developing such packages for vertical cavity surface emitting lasers there is a need to incorporate into the package a monitoring system which will automatically control the emissions emitted by the VCSEL. Generally, edge emitting laser diodes employ a power monitoring detector facing the back emission facet of the device. In a VCSEL with a wavelength shorter than 870 nm, there is no back emission due to the opaque substrate on which the device is necessarily formed.

In addition, there exist a need to incorporate into the fabrication of such vertical cavity surface emitting laser package an optical element, that is capable of being aligned in relation to the emission aperture of the vertical cavity surface emitting laser by automated techniques. This alignment of the lens relative to the laser beam is very critical. Currently alignment is done manually to achieve the required alignment precision, impacting volume production.

Therefore, there exist a need for improved packaging of vertical cavity surface emitting lasers, more specifically a lower cost semiconductor laser package that has included therein a power monitoring system, thus allowing automatic power control (APC) of the VCSEL emission and an optical element that is capable of being precision aligned relative to the laser emission aperture.

Thus there is a need for a low cost semiconductor laser package that has included therein a means for proper z-axis alignment of an optical element relative to a laser emission aperture, a power monitoring system, thus allowing for automatic power control (APC) of the VCSEL emission, utilizing low cost materials and simple fabrication techniques.

Accordingly, it is highly desirable and an object of this invention to provide for a low cost semiconductor laser package that allows for packaging of a VCSEL, monitoring device capable of monitoring the VCSEL emission and an optical element, easily aligned within the required z-axis parameters.

It is a still further purpose of the present invention to provide for a new and improved semiconductor laser package that incorporates proper z-axis alignment of the laser chip emission aperture relative to the optical element.

It is another purpose of the present invention to provide for a new and improved semiconductor laser package that is inexpensive, easily fabricated and allows for automated fabrication, thereby increasing volume output.

SUMMARY OF THE INVENTION

The above problems and others are substantially solved and the above purposes and others are realized in a semiconductor laser package including a vertical cavity surface emitting laser (VCSEL) generating an emission along a path, a power monitoring system, more particularly a photodiode, a mounting structure at least partially encapsulating the vertical cavity surface emitting laser and the power monitoring system, the mounting structure capable of providing support for the mounting of the vertical cavity surface emitting laser and the power monitoring system and an optical element mounted to an uppermost aspect of the mounting structure, thereby providing for proper z-axis alignment of the optical element relative to the vertical cavity surface emitting laser. In one embodiment, the mounting structure is formed as a typical TO-can type structure. In an alternative embodiment, the mounting structure is formed as a surface mounted structure and includes a leadframe having positioned thereon a ring-like structure serving as a spacer element, thereby capable of providing for z-axis alignment of the optical element relative the laser emission aperture.

The optical element is fabricated to allow for interlocking with the uppermost aspect of the mounting structure, utilizing interlocking structures such as snap-fit protrusions and cooperating recesses, or alternatively can be mounted to the mounting structure utilizing optically transparent index matching adhesive, threaded connections, or the like.

The mounting structure can be formed as one molded piece or as separate pieces as previously stated. There is optionally included within the mounting structure an underfill material having a coefficient of thermal expansion (CTE) equivalent to the vertical cavity surface emitting laser, thereby protecting the vertical cavity surface emitting laser from degradation due to mechanical stress caused by different coefficients of thermal expansion.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE PREFERRED EMBODIMENT

Figure 1:
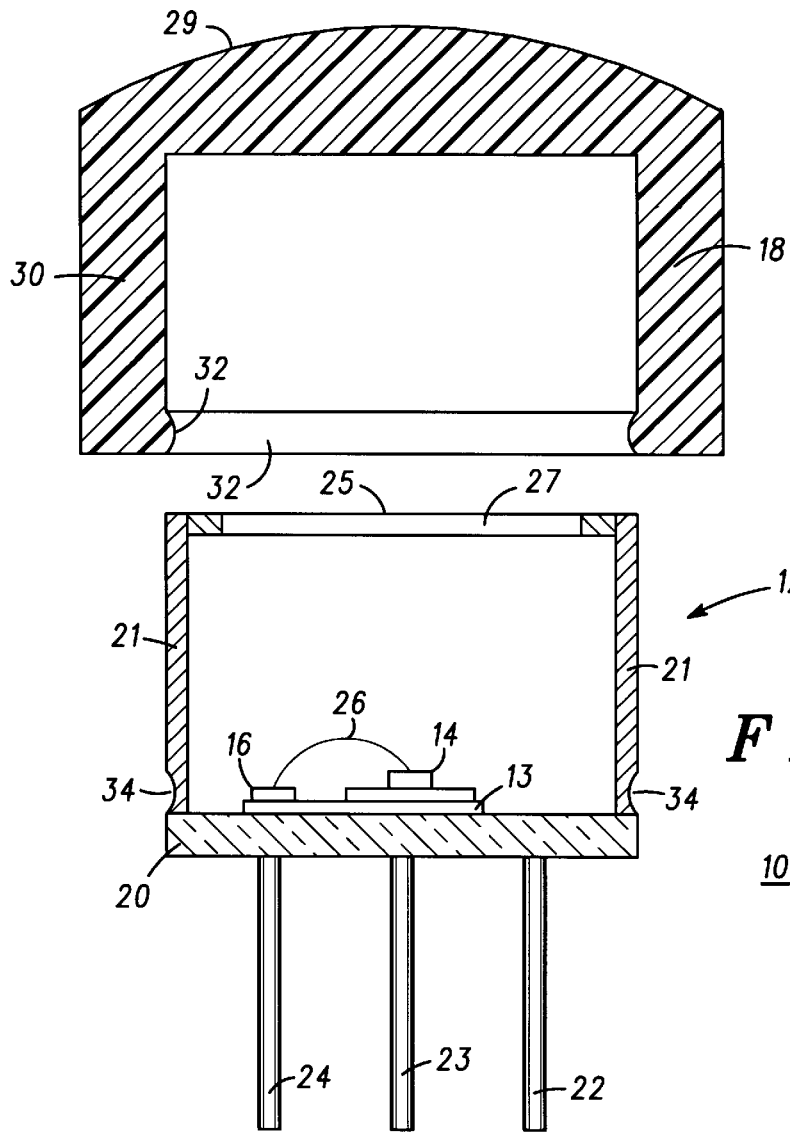
FIG. 1 is a simplified sectional view of a first embodiment of the semiconductor laser package of the present invention wherein the mounting structure is formed as a typical TO-can type structure, illustrating snap-fit interlocking of an optical element.
Figure 2:
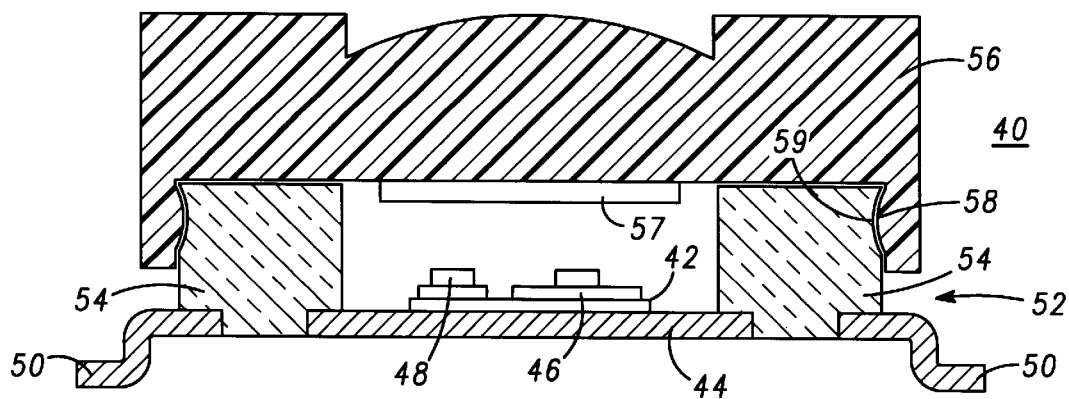
FIG. 2 is a simplified sectional view of a second embodiment of the semiconductor laser package of the present invention illustrating a surface mount package, wherein the mounting structure is formed to include a leadframe and ring-like structure, thus allowing for proper z-axis alignment of an attached optical element.
Figure 5:
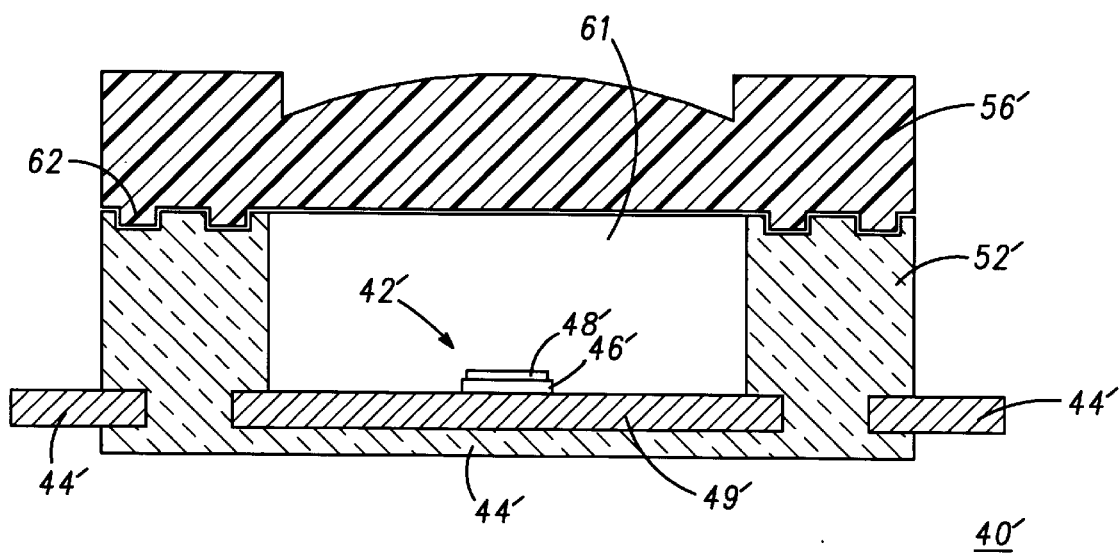
FIG. 5 is a simplified sectional view taken through line 5—5 of FIG. 6.
Figure 6:
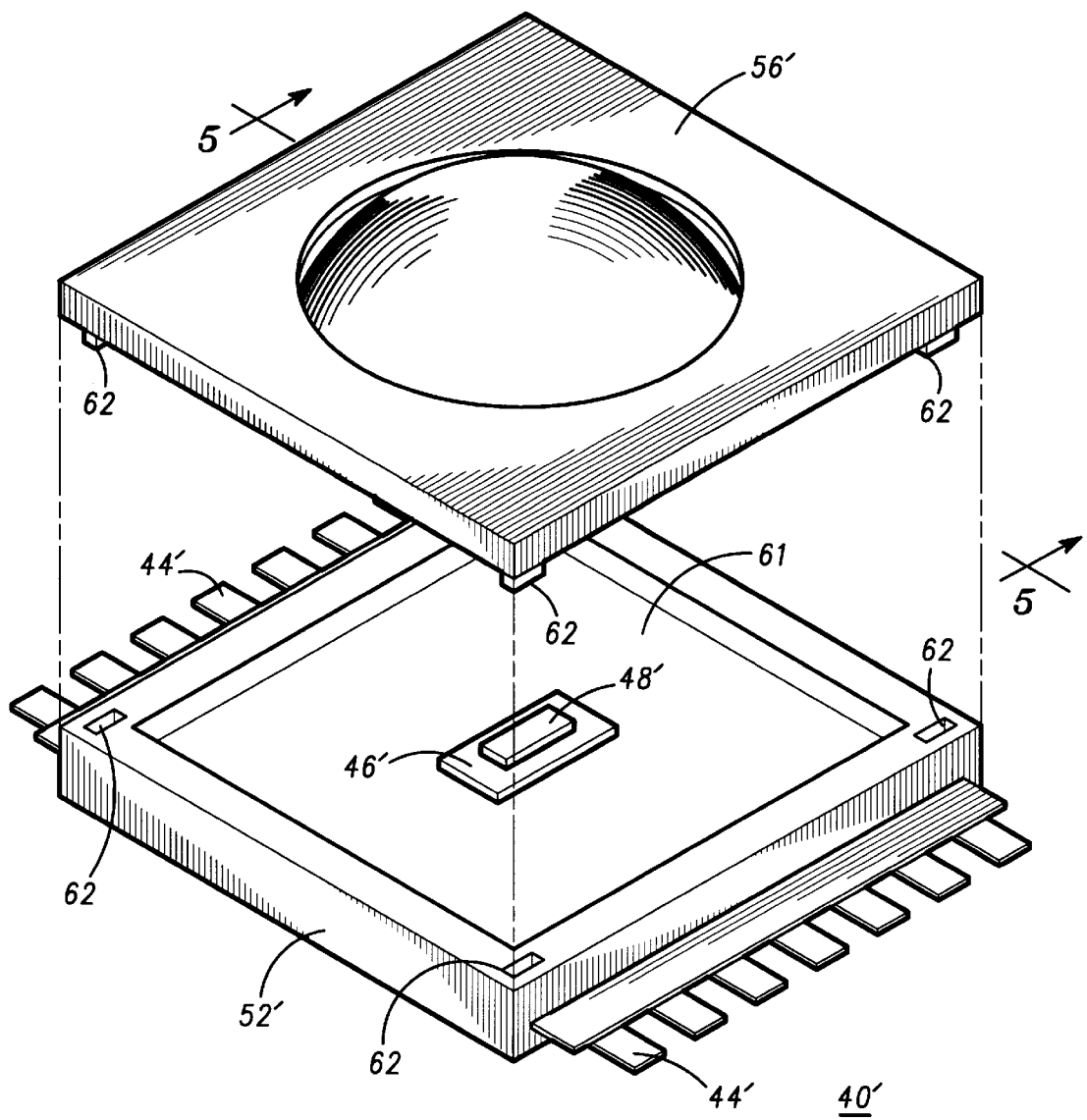
FIG. 6 is a simplified isometric view of a semiconductor laser package in accordance with the present invention.

Turning now to the drawings, illustrated in FIG. 1 is a first embodiment of a semiconductor laser package 10 according to the present invention. Semiconductor laser package 10 is composed of a mounting structure 12, which in this particular embodiment is fabricated as a typical TO-can type structure. Enclosed within mounting structure 12 is a laser chip 13, generally composed of a vertical cavity surface emitting laser (VCSEL) 14 and a power monitoring system 16, such as a photodiode. Briefly, the VCSEL 14 of FIG. 1, and similarly for FIGS. 2 and 5–6, is fabricated on any suitable semiconductor substrate, such as gallium arsenide, indium phosphide, or the like where the semiconductor substrate provides a surface. A first stack of distributed Bragg reflectors, an active region, and a second stack of distributed Bragg reflectors are epitaxially deposited on the surface by any suitable method, such as molecular beam epitaxy (MBE), metal-organic chemical vapor deposition (MOCVD), or the like. The first stack of distributed Bragg reflectors includes a plurality of layers of semiconductor material with alternating indexes of refraction. The active region is grown on the upper surface of the first stack of distributed Bragg reflectors, which includes one or more quantum wells separated by barrier layers with a spacer and/or cladding layer on either side thereof. The quantum wells and spacer layers are also grown epitaxially. The second stack of distributed Bragg reflectors is formed on the upper surface of the active region by, for example, epitaxially growing pairs of semiconductor layers as described in conjunction with the first stack. The first and second stacks are doped with opposite conductivity types to form a two terminal (diode) structure for the flow of electrical current therethrough. An electrical contact is positioned over the lower surface of the substrate. With the epitaxial depositions being complete, the second stack of distributed Bragg reflectors is patterned to form a ridge. Generally, the VCSEL is made by any suitable well known method in the art, such as photolithography, etching, lift-off, any combination thereof, or the like. By defining a ridge in the second stack of distributed Bragg reflector, an optical path is defined in the second stack of distributed Bragg reflectors that reflects and guides light formed in the active region. A complete disclosure of the construction of VCSELs, such as that intended for use in the present invention, and more particularly the construction of ridge VCSELs is available in U.S. Pat. No. 5,256,596 entitled "TOP EMITTING VCSEL WITH IMPLANT", issued Oct. 26, 1993, assigned to the same assignee and incorporated herein by this reference.

Once the epitaxial depositions are complete and VCSEL 14 has been formed, a series of depositions and patterning steps are performed to fabricate an integrally formed photodetector 16. Alternatively, and as previously stated, photodetector 16 can be fabricated as a separate device, laterally positioned from VCSEL 14 on the substrate or on a separate substrate, or a second VCSEL can be formed in series with VCSEL 14, having a photodetector flip chip mounted thereupon, so as to monitor laser emissions from the second VCSEL, similar to those of VCSEL 14. Generally during fabrication of laser chip 13, composed of VCSEL 14 and photodetector 16, the depositions are performed by any suitable well-known method in the art such as chemical vapor deposition (CVD), plasma enhanced chemical vapor deposition (PECVD), sputtering, or the like. In addition, the patterning steps also are performed by any suitable well-known methods or processes in the art, such as photolithography, lift-off, etching, or combination thereof. Further information and more detailed descriptions regarding the fabrication of specific embodiments of laser chip 13 utilized in laser package 10 of the present invention can be found in the following U.S. patents: (i) U.S. Pat. No. 5,742,630, entitled "VCSEL WITH INTEGRATED PIN DIODE", filed on Jul. 1, 1996, assigned to the same assignee and incorporated herein by this reference, (ii) U.S. Pat. No. 5,751,757, entitled "VCSEL WITH INTEGRATED MSM DIODE", filed on Jul. 1, 1996, assigned to the same assignee and incorporated herein by this reference, (iii) U.S. Pat. No. 5,757,836 entitled "VERTICAL CAVITY SURFACE EMITTING LASER WITH LATERALLY INTEGRATED PHOTODETECTOR", filed on Jul. 1, 1996, assigned to the same assignee and incorporated herein by this reference, (iv) U.S. patent application entitled "REFLECTION POWER MONITORING SYSTEM FOR VERTICAL CAVITY SURFACE EMITTING LASERS", Ser. No. 08/639,462, filed on Apr. 29, 1996, assigned to the same assignee and incorporated herein by this reference, and (v) U.S. patent application entitled "FLIP CHIP POWER MONITORING SYSTEM FOR VERTICAL CAVITY SURFACE EMITTING LASERS", Ser. No. 08/641,256, filed on Apr. 30, 1996, assigned to the same assignee and incorporated herein by this reference.

The disclosed embodiment of laser chip 13, more specifically VCSEL 14 with a power monitor serve as the emitting device and the monitoring device in laser package 10 of the present invention, thus capable of automatic power control (APC) by monitoring the emissions from the VCSEL 14. As previously stated, the monitoring is accomplished by fabricating and/or positioning photodetector 16 to receive and monitor a portion of the emissions passing therethrough or reflected from an optical element designed as a part of the laser package (discussed presently).

The disclosed embodiments of the photodetectors 16 act as monitoring devices to monitor the emissions from the VCSELs 14. As previously stated, this is accomplished by fabricating and/or positioning photodetector 16 to receive and monitor a portion of the emissions passing therethrough or reflected from an optical element 18. In the first disclosed embodiment of the semiconductor laser package of the present invention, the VCSEL device and monitoring system includes a TO-can type package, more specifically a mounting structure, fabricated so as to completely enclose and protect VCSEL 14 and photodetector 16 of the present invention. Illustrated in FIG. 1 is a simplified isometric view of laser package 10 including mounting structure 12 in accordance with the present invention. Mounting structure 12 is typically formed of a molded plastic having similar dimensions to the current metal TO-can packages. In the preferred embodiment mounting structure 12 is formed of an opaque plastic mounting base 20, thereby preventing external background light from entering the monitoring photodetector. There is formed a metal lead 22 to provide the ground contact for VCSEL 14 and photodetector 16. In addition, there is provided a lead 23 or contact pin for electrical interface with the VCSEL 14, and a third lead 24 or contact pin for electrical interface with the photodetector.

Mounting structure 12 is generally formed of a mounting base 20, sidewalls 21, formed of an opaque or transparent injection or transfer molded plastic well known in the art, or alternatively formed of metal, and an optional substantially transparent cover 25 enclosing the upper surface of mounting structure 12. It is additionally disclosed that mounting structure 12 can be fabricated as a one-piece unit, using either injection or transfer molding techniques. Mounting structure 12 when fabricated of plastic, has a coefficient of thermal expansion (CTE) in a range of 10–30 ppm with a preferred CTE of 20 ppm or less. A plurality of wire bond interconnects 26, or similar interconnections, serve to electrically interface VCSEL 14 and photodetector 16 with metal leads 23 and 24. Cover 25 has formed therein an opposing relationship with mounting base 20, an uppermost transparent portion 27. It is disclosed, that there is optionally provided a layer of moisture getter (not shown), such as silica beads, formed on an interior of mounting structure 12, thereby protecting VCSEL 14 from moisture and maintaining a low dew point within structure 12.

In an alternative embodiment, the TO-can type structure which forms mounting structure 12 can be molded whereby laser chip 13 is completely overmolded by the molding material. In this instance, the coefficient of thermal expansion (CTE) of the molding material as well as the laser chip becomes important due to probable VCSEL degradation, and in some instances may require a layer of underfill prior to the overmolding of laser chip 13 (discussed presently).

As previously stated, there is included as a portion of laser package 10, optical element 18. In this embodiment, optical element 18 is shown as having a curved uppermost surface 29, generally exhibiting diffractive and/or refractive optical properties. Alternatively, a planar optical element or an optical element exhibiting holographic optical properties may be included within optical element 18 (discussed presently). Optical element 18 has formed as a part thereof, a flexible side support ring 30 thereby allowing optical element 18 to be snap-fit over the exterior of mounting structure 12. More specifically, optical element 18 is slideably moved over the exterior aspect of mounting structure 12 by forcing flexible side support ring 30 over sidewalls 21 of mounting structure 12. There is provided within an interior of flexible side support ring 30, a ridge-like structure 32 capable of interlocking with a depressed area 34 formed in sidewalls 21 of mounting structure 12. During assembly, proper z-axis alignment of the optical element is achieved when this interlocking mechanism, or snap-fit, is properly engaged.

Currently, in the field of semiconductor laser packaging, alignment techniques of the optical element relative to the laser emission aperture are unreliable at best. Due to poor die placement accuracy by machine, which is typically ±80 μm, manual z-axis alignment is needed to control the relative distance between the optical element, or lens, and the laser emission aperture. This manual alignment procedure not only increases the system packaging cost, but also limits the manufacturing throughput. In this particular embodiment of the package of the present invention, the positioning of optical element 18, relative to the emission aperture is application or use dependent. Once application dependency is solved, sidewalls 21 and optical element 18 can be dimensionally fabricated to allow for proper required z-axis alignment relative to an underneath side of laser chip 13 or an uppermost surface of mounting base 20. In using such points as z-axis references, laser chip 13 thickness must be accurately controlled to eliminate any variance.

Referring now to FIG. 2, illustrated in simplified sectional view is a second embodiment of a laser package 40 according to the present invention. In this particular embodiment, laser package 40 is fabricated as a surface mount package, more particularly package 40 utilizes a leadframe as a portion of a mounting structure 52 onto which a laser chip 42, a ring-like support structure 54 and an optical element 56, such as a curved or planar optical element, including diffractive, refractive, and/or holographic optical properties, are positioned. As illustrated, laser package 40 is fabricated so as to mount laser chip 42, generally similar in fabrication to laser chip 13, previously described, onto a copper leadframe 44. Laser chip 42 is generally composed of a VCSEL 46 and photodiode 48 and is mounted onto a copper flag portion 49 of copper leadframe 44. There are provided a plurality of surface mount lead connections 50, extending from package 40 thereby allowing for external interfacing of package 40. During fabrication, a mounting structure 52, composed of leadframe 44 and a sidewall or ring-like structure 54, is fabricated of sufficient z-axis dimension thereby providing for proper z-axis positioning of an optical element 56. Ring-like structure 54 is typically fabricated of a plastic resin utilizing injection or transfer molding techniques and is mounted to an uppermost major surface of leadframe 44, thereby at least partially encapsulating VCSEL 46 and photodiode 48. It is disclosed, that there is optionally provided a layer of moisture getter (not shown), such as silica beads, formed on an interior of ring-like structure 54 or on a surface of leadframe 44, thereby protecting VCSEL 46 from moisture and maintaining a low dew point within the area surrounding VCSEL 46. Optical element 56 is fabricated generally similar to optical element 18 of the previous embodiment and may include any one of a plurality of optical properties. As illustrated, there are provided cooperating protruding portions 58 on optical element 56 and depressed areas 59 formed on ring-like structure 54, thereby providing for an interlocking, or snap-fit, of optical element 56 to mounting structure 52. As in the previous embodiment, proper z-axis alignment is provided from the laser emission aperture by dimensionally fabricating optical element 56 to position and interlock with mounting structure 52 dependent upon application.

As illustrated in FIG. 2, there is optionally provided a hologram 57, or holographic optical element (HOE), formed oil a lower aspect of optical element 56. HOEs are used to divide and shape emissions from VCSELs, more specifically laser emissions from VCSEL 46. HOE 57 employs a transmission grating to divide the emission into three beams for three-beam-spot detection in compact disk (CD) pickups. Alternatively, it can be designed to have approximately 10% of the diffraction beam deflected from the HOE 57 toward the photodetector 48 of laser chip 42 positioned adjacent VCSEL 46.

Figure 3:
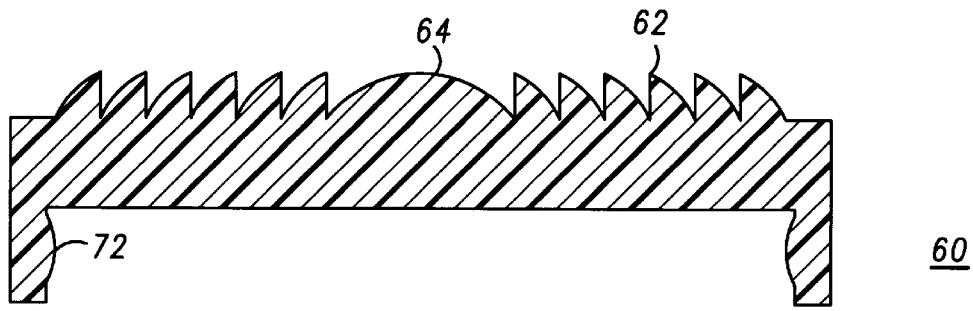
FIG. 3 is a simplified sectional view of a snap-fit optical element incorporating holographic and diffractive optical properties.
Figure 4:
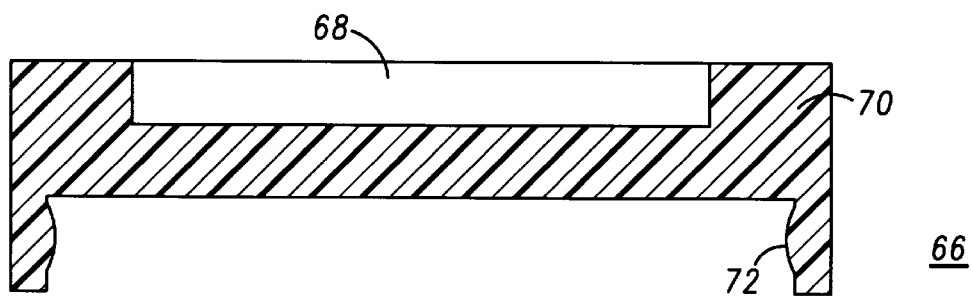
FIG. 4 is a simplified sectional view of a snap-fit optical element incorporating an embedded volume hologram.

Referring now to FIGS. 3 and 4, illustrated are alternative embodiments of the optical element 18 and 56 of the present invention. Illustrated in FIG. 3 is an optical element 60, generally similar to optical element 18 and/or 56, fabricated to include holographic optical properties 62 in combination with diffractive optical properties 64. Illustrated in FIG. 4, is an optical element 66 including a volume hologram 68 mounted on a surface of a transparent injection molded flat-surfaced element. The volume hologram 68 is designed to function like a lens to accomplish beam collimating and/or beam focusing. The design of the optical element 18 and/or 56 of laser package 10 and/or 40 is dependent upon the specific application, or use, of the package. Of importance is the incorporation of interlocking and/or positioning mechanism generally composed of protruding portions 72 and cooperating recessed areas formed on the mounting structure, as previously described. It should be understood that additional interlocking mechanism, including threaded connections, the use of index matching optically transparent adhesive, and other variations of snap-fit connections of the optical element to the mounting structure of the present invention are anticipated by this disclosure.

Referring now to FIGS. 5 and 6 illustrated is a simplified cross section and simplified isometric view of a third embodiment of a semiconductor laser package of the present invention, more particularly a surface mounted package housing a vertical cavity surface emitting laser with a vertically integrated photodetector in accordance with the present invention. It should be noted that all components similar to the components illustrated in FIG. 2, are designated with similar numbers, having a prime added to indicate the different embodiment. Illustrated in FIG. 5 is semiconductor laser package 40' fabricated generally similar to semiconductor laser package 40 of FIG. 2. There is provided a laser chip 42', more specifically a VCSEL 46' with a vertically integrated photodetector 48'. Laser chip 42' is mounted on a copper flag 49' portion of a leadframe 44' as previously described with regard to package 40, and overmolded with a plastic resin mounting structure 52' of specific dimensional requirements, thereby forming an enclosure for laser chip 42' and mounting support for an optical element 56'. As in the previous embodiments, mounting structure 52' is formed utilizing injection or transfer molding techniques, common in the art, with the mounting structure 52' having a coefficient of thermal expansion (CTE) in a range of 10–30 ppm, with a preferred CTE of 20 ppm or less. There is provided as a portion of mounting structure 52' an optical element 56', including cooperating interlocking mechanism 62, thereby allowing for proper z-axis alignment and positioning of optical element 56' relative to the laser emission aperture. In addition, there is optionally included an underfill material 61, generally formed from the same composition as the molding compound for mounting structure 52' for index matching purposes. Due to this one-piece type of molding of mounting structure 52', underfill material 61 can be a silicon gel, or any type of polymer, that has similar thermal expansion coefficients as that of laser chip 42', thereby reducing thermal stress by preventing the molding compound from direct contact with laser chip 42'.

It should be understood that in the disclosed preferred embodiments of the semiconductor package of the present invention, that the mounting base, if included, and vertical portions of the mounting structure, more specifically the sidewalls which form the ring-like structure, and alternatively corresponding portions of the one-piece molded surface mounted unit, are formed of a substantially opaque molded plastic resin, with a transparent portion formed on the uppermost plane of the structure, or an open void;, thereby permitting the laser emission to pass therethrough and preventing external background light from entering the package and thus interfering with the monitoring device. It is further disclosed that alternatively, the mounting base and sidewalls, and alternatively corresponding portions of the one-piece molded surface mounted unit, can be formed of a substantially transparent molded plastic. In addition, as stated it should be understood that the mounting structure as disclosed, can be molded as one integral piece as illustrated in FIG. 5.

Due to the low power operation of vertical cavity surface emitting lasers in general, thermal dissipation of such a plastic package should not be a problem. Accordingly, as previously stated there is optionally provided transparent epoxy or an underfill type material, with a coefficient of thermal expansion (CTE) equivalent to the vertical cavity surface emitting laser, thereby providing a buffer prior to the molding of the plastic package, more specifically the mounting structure, about the device or enclosure of the device within the molded plastic structure.

Thus, a semiconductor laser package with power monitoring system and interlocking optical element, allowing for proper z-axis alignment of the optical element relative to the laser emission aperture is disclosed. More specifically disclosed is a mounting structure, having contained therein a vertical cavity surface emitting laser having provided as a separate device or formed integral therewith, a photodetector that dependent upon device application, allows for z-axis alignment of an interlocking optical element. The optical element is positioned within the emission path of the vertical cavity surface emitting laser, thereby serving to permit substantially 90% of the laser emission to pass therethrough when a vertically integrated photodetector is utilized, or permitting a substantial portion of the laser emission to pass therethrough while reflecting back a small percentage for monitoring by the photodetector when a laterally integrated or laterally positioned photodetector is utilized. The mounting structure is typically formed of molded plastic thereby increasing yield by reducing the cost of the finished product.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A semiconductor laser package comprising:
    a vertical cavity surface emitting laser generating an emission along a path;
    a power monitoring system laterally spaced apart from the vertical cavity surface emitting laser and optically positioned to receive a portion of the emission;
    a mounting structure at least partially encapsulating the vertical cavity surface emitting laser and the power monitoring system, and capable of providing support for mounting of the vertical cavity surface emitting laser and the power monitoring system; and
    an optical element mounted to an uppermost aspect of the mounting structure utilizing snap-fit connections, thereby providing for proper z-axis alignment of the optical element relative to the vertical cavity surface emitting laser, the optical element including optical properties to direct a portion of the laser emission toward the power monitoring system.

2. A semiconductor laser package according to claim 1 wherein the optical element includes diffractive optical properties and is formed as one of a curved optical element and a planar optical element.

3. A semiconductor laser package according to claim 1 wherein the optical element includes refractive optical properties and is formed as one of a curved optical element and a planar optical element.

4. A semiconductor laser package according to claim 1 wherein the optical element includes holographic optical properties including a transmission grating for splitting the emission and is formed as one of a curved optical element and a planar optical element.

5. A semiconductor laser package according to claim 4 wherein the holographic optical properties include a volume hologram mounted on a surface of a transparent injection molded flat-surfaced element.

6. A semiconductor laser package according to claim 5 wherein the volume hologram functions as a lens for at least one of beam collimating and beam focusing.

7. A semiconductor laser package according to claim 1 wherein the power monitoring system is a photodetector.

8. A semiconductor laser package according to claim 1 wherein the mounting structure is formed as a TO-can type mounting structure, including a mounting base, sidewalls and a cover.

9. A semiconductor laser package according to claim 8 wherein the mounting structure is molded as a one-piece unit.

10. A semiconductor laser package according to claim 1 wherein the mounting structure is a leadframe having positioned on an uppermost major surface a plastic resin ring-like structure.

11. A semiconductor laser package comprising:
   a vertical cavity surface emitting laser generating an emission along a path;
   a photodetector positioned laterally spaced apart from the vertical cavity surface emitting laser and optically positioned to receive a portion of a reflected emission;
   a mounting structure at least partially encapsulating the vertical cavity surface emitting laser and the photodetector, and capable of providing support for mounting of the vertical cavity surface emitting laser and the photodetector; and
   an optical element including optical properties to direct a portion of the laser emission toward the photodetector, snap-fit mounted to an uppermost aspect of the mounting structure, utilizing snap-fit connections thereby positioning the optical element in the path of the laser emission and providing for proper z-axis alignment of the optical element relative to an emission aperture of the vertical cavity surface emitting laser.

12. A semiconductor laser package according to claim 11 wherein the optical element is fabricated as one of a curved optical element and a planar optical element and includes at least one of diffractive, refractive, and holographic optical properties.

13. A semiconductor laser package according to claim 12 wherein the one of a curved optical element and a planar optical element includes a volume hologram mounted on a surface of a transparent injection molded flat-surfaced element and functions as a lens for at least one of beam collimating and beam focusing.

14. A semiconductor laser package according to claim 11 wherein the mounting structure is fabricated as one of a TO-can type mounting structure including a mounting base, sidewalls and a cover, and a surface mount structure, including a leadframe and a ring-like structure.

15. A semiconductor laser package according to claim 14 wherein the mounting structure is molded as a one-piece unit.

16. A semiconductor laser package comprising:
   a vertical cavity surface emitting laser generating an emission along a path;
   a photodetector laterally spaced apart from the vertical cavity surface emitting laser and optically positioned to receive a portion of the emission;
   a TO-can type mounting structure including a mounting base, sidewalls and a cover, at least partially encapsulating the vertical cavity surface emitting laser and the photodetector, and capable of providing support for mounting of the vertical cavity surface emitting laser and the photodetector; and
   an optical element including optical properties to direct a portion of the laser emission toward the photodetector, the optical element snap-fit mounted to an uppermost aspect of the TO-can type mounting structure, utilizing snap-fit: connections thereby positioning the optical element in the path of the laser emission and providing for proper z-axis alignment of the optical element relative to an emission aperture of the vertical cavity surface emitting laser.

17. A semiconductor laser package according to claim 16 wherein the optical element is fabricated as one of a curved optical element and a planar optical element and includes at least one of diffractive, refractive, and holographic optical properties.

18. A semiconductor laser package according to claim 17 wherein the optical element includes a volume hologram mounted on a surface of a transparent injection molded flat-surfaced element.

19. A semiconductor laser package according to claim 18 wherein the volume hologram functions as a lens for at least one of beam collimating and beam focusing.

20. A semiconductor laser package according to claim 16 wherein the TO-can type mounting structure is molded as a one-piece unit.

21. A semiconductor laser package comprising:
   a vertical cavity surface emitting laser generating an emission along a path;
   a photodetector laterally spaced apart from the vertical cavity surface emitting laser and optically positioned to receive a portion of the emission;
   a surface-mount mounting structure including a leadframe and ring-like structure, at least partially encapsulating the vertical cavity surface emitting laser and the photodetector, and capable of providing support for mounting of the vertical cavity surface emitting laser and the photodetector; and
   an optical element including optical properties to direct a portion of the laser emission toward the photodetector, the optical element snap-fit mounted to an uppermost aspect of the surface mount mounting structure, utilizing snap-fit connections thereby positioning the optical element in the path of the laser emission and providing for proper z-axis alignment of the optical element from the vertical cavity surface emitting laser.

22. A semiconductor laser package according to claim 21 wherein the optical element is fabricated as one of a curved optical element and a planar optical element and includes at least one of diffractive, refractive, and holographic optical properties.

23. A semiconductor laser package according to claim 22 wherein the optical element includes a volume hologram mounted on a surface of a transparent injection molded flat-surfaced element, and functions as a lens element for at least one of beam collimating and beam focusing.

* * * * *